United States Patent [19]

Estanislao et al.

[11] Patent Number: 4,935,705
[45] Date of Patent: Jun. 19, 1990

[54] HIGH EFFICIENCY VARIABLE POWER AMPLIFIER

[75] Inventors: Cris S. Estanislao, Sunrise; Ole Hammer, Coral Springs, both of Fla.

[73] Assignee: Motorola, Inc., Schaumburg, Ill.

[21] Appl. No.: 291,883

[22] Filed: Dec. 29, 1988

[51] Int. Cl.$^5$ ............................................... H03F 3/68
[52] U.S. Cl. .................................... 330/296; 330/285; 330/310
[58] Field of Search ............... 330/130, 133, 136, 140, 330/285, 296, 310, 311

[56] References Cited

U.S. PATENT DOCUMENTS

| | | | |
|---|---|---|---|
| 3,825,851 | 7/1974 | Smith | 330/285 X |
| 4,313,210 | 1/1982 | Hume et al. | 455/117 |
| 4,523,155 | 6/1985 | Walczak et al. | 330/279 |
| 4,727,337 | 2/1988 | Jason | 330/298 |
| 4,728,905 | 3/1988 | Zhiwei | 330/310 X |

OTHER PUBLICATIONS

68P81044C05-0, Motorola Theory/Maintenance Saber TM Manual, 1989, p. 13.
68P81055C25-0, Motorola MX1000 Service Manual, 1988, p. 27.

Primary Examiner—Steven Mottola
Attorney, Agent, or Firm—Juliana Agon; Daniel K. Nichols; Thomas G. Berry

[57] ABSTRACT

A high efficiency variable power amplifier suitable for use in a battery powered device is provided wherein a variable power amplifier has at least a first (2) and a second (12) amplification stage. Base bias potential (8) for the second amplification stage (12) is derived from the bias potential provided to the first amplification stage. In this way, as the bias potential to the first amplification stage is modified to vary the output power, the base bias potential for the second amplification stage is correspondingly modified to maintain the amplifier's efficiency.

8 Claims, 1 Drawing Sheet

HIGH EFFICIENCY VARIABLE POWER AMPLIFIER

BACKGROUND OF THE INVENTION

This invention relates generally to radio frequency power amplifiers, and more specifically to variable power radio frequency power amplifiers, and is particularly directed towards providing a high efficiency variable power radio frequency amplifier.

The efficiency of any amplifier is determined by its ability to appropriately amplify an input signal without consuming an excessive amount of energy. Typically, the energy consumed by an amplifier is chiefly attributed to the bias currents drawn by the amplifier. Ordinarily, higher bias current consumption is directly related to the heat energy that is generated during the amplifier operation. Accordingly, a more efficient amplifier will generate less heat and consume less current when amplifying an input signal.

Class C is the most efficient operation for RF amplifiers. To ensure biasing beyond cutoff for class C operation, the transistor base bias voltage is maintained below threshold (less than 0.7 Vdc) for a bipolar silicon transistor. The lower the base voltage, the more efficient the amplifier (0 Vdc or lower is the best).

A significant detriment of amplifiers having variable output power is their inability to maintain efficient operation across the full range of their variable output power. Conventional variable power amplifiers are customarily designed to maximize efficiency at the maximum power level to be used. Reduced efficiency at other power levels is tolerated based upon the expectation that the amplifier will ordinarily operate at the more efficient power level.

For variable power amplifiers operating in a battery powered transmitter, reduced amplifier efficiency decreases the battery life. This is particularly detrimental in applications where the amplifier does not operate predominantly at a single power output level.

Accordingly, a need exist in the art for a variable power amplifier having an improved efficiency over its variable power range to maximize battery life of a battery powered transmitter.

SUMMARY OF THE INVENTION

Accordingly, it is an object of the present invention to provide a high efficiency variable power amplifier suitable for use in a battery powered device.

Briefly, according to the invention, a variable power amplifier has at least a first and a second amplification stage. Base bias potential for the second amplification stage is derived from the collector bias potential provided to the first amplification stage. In this way, as the collector bias potential to the first amplification stage is modified to vary the output power, the base bias potential for the second amplification stage is correspondingly modified to maintain the amplifier's efficiency.

DETAILED DESCRIPTION OF THE PREFERRED EMBODIMENT

Figure 1:
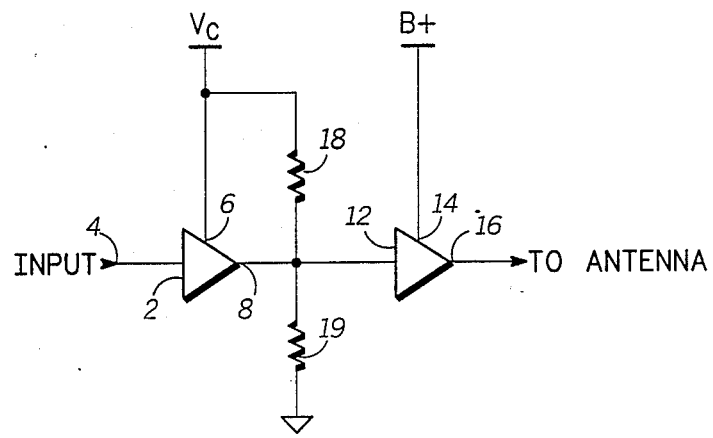
FIG. 1 is a schematic diagram of an amplifier in accordance with the present invention.

Referring first to FIG. 1, is a schematic diagram of an amplifier in accordance with the present invention is illustrated. Two amplification stages are shown with their respective voltage biases. A first amplification means comprises a power amplifier 2 having an input port 4 and having a first bias potential coupled to its collector input 6. The first bias potential comprises a control voltage (Vc) which is conventionally supplied by an automatic level control circuit for varying the collector voltage to maintain constant power output at the antenna at any selected level of its power level range. The output of the first amplifier 8 is coupled to the input of a second amplifier 12 whose collector input is coupled to a fixed bias (B+) at collector input 14. The second amplifier 12 has its RF output 16 coupled to an antenna for RF transmission. The second power amplifier 12, comprising a second amplification means derives its base bias voltage from the first amplifier 2 via a voltage divider coupled between the control voltage (Vc) and ground. The voltage divider is comprised of series resistors 18 and 19. In this way, the base bias voltage of the second amplifier tracks the first amplifier and maintains the second amplifier's base bias voltage in a range close to zero volts as possible for maximum efficiency. A typical range of base bias voltage would be from less than 0.1 volts to 0.3 volts.

Figure 2:
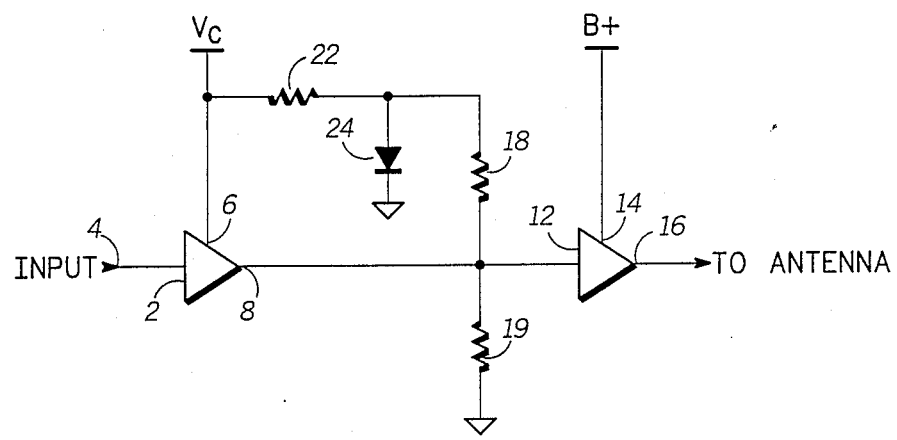
FIG. 2 is an alternate embodiment of an amplifier in accordance with the present invention.

Referring to FIG. 2, which is an alternate embodiment of an amplifier in accordance with the present invention, the only elements different from the schematic diagram of FIG. 1 are an additional series resistor 22 and a diode 24. In parallel with resistors 18 and 19, the diode 24 forms a diode clamp to clamp the maximum base bias voltage to a certain level if the control voltage (Vc) increases too high (to prevent quiescent turnon of the second amplifier if the base bias voltage is too high). The resistor 22, coupled between the control voltage Vc and the diode 24, limits the amount of current to the diode 24 such that the second amplifier 12 is cut-off at a faster rate as the control voltage (Vc) is lowered with a resultant quicker decrease in the base bias voltage fed into the base of the second amplifier 12.

It is preferable that the diode 24 comprises the same composition as transistor of amplifiers 2 and 12 (such as silicon) to provide additional temperature compensation. Even without the diode 24, the circuit of FIG. 1 has an inherent temperature compensation effect. At high temperatures, the gain of the power amplifier will drop so that the control voltage (Vc) will increase to maintain the same output power. As the control voltage increases, so will the base bias voltage of the second amplifier 12.

What is claimed is:
1. A radio frequency power amplifier comprising:
   first amplification means having an input port, an output port, and a port for receiving a variable amplifier bias potential;
   second amplification means having an output port, a port for receiving a fixed amplifier bias, and an input port coupled to said output port of said first amplification means; and
   bias means for receiving said variable amplifier bias potential to provide a variable input bias potential to said input port of said second amplification means to bias said second amplification means in a Class C mode.

2. The amplifier of claim 1 wherein said bias means comprises a voltage divider.

3. The amplifier of claim 1 wherein said bias means comprises a resistive voltage divider.

4. The amplifier of claim 1 wherein said bias means comprises a diode clamp and a voltage divider.

5. The amplifier of claim 1 wherein said first amplification means provides for a variable output signal.

6. The amplifier of claim 1 wherein said second amplification means provides for a variable output signal.

7. A radio frequency power amplifier comprising:
first amplification means for providing a variable output signal having an input port, an output port, and a port for receiving a variable amplifier bias potential;
second amplification means for providing a variable output signal having an output port, a port for receiving a fixed amplifier bias, and an input port coupled to said output port of said first amplification means; and
voltage divider bias means for receiving said variable amplifier bias potential to provide a variable input bias potential to said input port of said second amplification means to bias said second amplification means in a Class C mode.

8. A method of biasing a radio frequency power amplifier comprising the steps of:
a. providing a variable amplifier bias potential to a first amplifier and a fixed amplifier bias potential to a second amplifier;
b. decreasing said variable amplifier bias potential to provide a variable input bias potential; and
c. biasing an input of the second amplifier with said variable input bias potential to bias said second amplifier in a Class C mode.

* * * * *